(12) United States Patent
Chowdhury et al.

(10) Patent No.: US 7,157,361 B2
(45) Date of Patent: Jan. 2, 2007

(54) METHODS FOR PROCESSING INTEGRATED CIRCUIT PACKAGES FORMED USING ELECTROPLATING AND APPARATUS MADE THEREFROM

(75) Inventors: Musawir M. Chowdhury, Whitehall, PA (US); Charles Cohn, Wayne, NJ (US)

(73) Assignee: Agere Systems Inc., Allentown, PA (US)

( * ) Notice: Subject to any disclaimer, the term of this patent is extended or adjusted under 35 U.S.C. 154(b) by 212 days.

(21) Appl. No.: 10/878,157

(22) Filed: Jun. 28, 2004

(65) Prior Publication Data

US 2006/0014370 A1    Jan. 19, 2006

(51) Int. Cl.
*H01L 21/44*    (2006.01)
(52) U.S. Cl. .................. 438/612; 438/614; 438/674
(58) Field of Classification Search ................ 438/612, 438/613, 614, 674, 676, 121, 122, 125
See application file for complete search history.

(56) References Cited

U.S. PATENT DOCUMENTS 6,566,166 B1 * 5/2003 Chien .......................... 438/613
6,569,712 B1 * 5/2003 Ho et al. ..................... 438/613

* cited by examiner

*Primary Examiner*—Kevin M. Picardat

(57) ABSTRACT

An integrated circuit package is processed by electroplating the integrated circuit package. The electroplating is performed without forming plating traces on a conductive surface of a pad side of the integrated circuit package. Pad areas of the integrated circuit package are thus plated with one or more materials. An integrated circuit may be electrically coupled to pad areas on the integrated circuit package. The integrated circuit package can be electroplated by using the one or more current sources coupled to a back plane of the integrated circuit package. The back plane is patterned, wherein the patterning of the back plane occurs after the step of electroplating.

27 Claims, 17 Drawing Sheets

METHODS FOR PROCESSING INTEGRATED CIRCUIT PACKAGES FORMED USING ELECTROPLATING AND APPARATUS MADE THEREFROM

FIELD OF THE INVENTION

The present invention relates generally to packages for integrated circuits, and, more particularly, to processing packages for integrated circuits where the packages are electroplated without the use of plating traces.

BACKGROUND OF THE INVENTION

A Ball Grid Array (BGA) or Pin Grid Array (PGA) package for a high power dissipating integrated circuit (IC) typically contains a cavity suitable for packaging the integrated circuit. One side of the package (called the "backside" herein) will be connected to a heat sink and the other side (called the "pad side" herein) of the package will have pad areas formed for the attachment of solder balls or pins. The integrated circuit resides in the cavity, and between the backside and the pad side.

Packages have a number of layers formed usually from copper and dielectric materials. Certain layers may also be formed from solder mask or other materials. The copper layers are used to provide power planes, provide ground planes, and route signal lines from the integrated circuit to appropriate through-holes. Through-holes are formed in the layers, and the through-holes connect power planes, connect ground planes, and provide connection from power planes, ground planes, and signal lines to pad areas on the pad side of the package. The pad areas on the pad side of the package are used to mechanically and electrically couple the package and therefore the integrated circuit to a circuit board, typically through solder balls or pins.

Additionally, pad areas internal to the package are used to couple an IC to the package. One type of electrical coupling of the IC to the package is created through a process called ball-wedge wire bonding. In this case, small diameter wires made of gold, or other materials, electrically couple the IC to the package. Electrical coupling is accomplished by first bonding one end of the bond wires to pads on the surface of the IC, and the other end is then bonded to pad areas (called wedge bond pads) located inside the package cavity.

The gold bond wires typically do not bond well to copper surfaces. Consequently, when copper is used to form a wedge bond pad area, the copper is typically plated with one or more metals, one of which does bond well with common bond wire materials. By way of illustration, a nickel layer can be formed on the copper and a gold layer can be formed on the nickel layer.

The nickel and gold layers are usually formed through electroplating. In order to electroplate, conventional techniques form plating traces on a conductive surface, typically made of copper, of the pad side. The plating traces are used to electrically couple the conductive surface of the pad side of the integrated circuit package to a current source used during electroplating. A patterned mask is applied to at least the conductive surface to form the pad areas and to protect areas that will not be electroplated. Additionally, there are selected wire bonding pad areas internal to the package cavity that are also to be electroplated. These internal selected wire bonding pad areas are electrically coupled through the through-holes to the conductive surface so that the internal selected wire bonding pad areas will also be plated during electroplating. After electroplating, the plating traces are, in general, removed to improve the electrical performance of ICs operating at high frequencies, greater than approximately 2 gigahertz (GHz).

Although plating traces on the pad side of an integrated circuit package provide adequate current for electroplating, there are problems with removing the plating traces on the pad side after electroplating. A need therefore exists for processing techniques and apparatus that are not subject to these problems.

SUMMARY OF THE INVENTION

Generally, methods are provided for processing integrated circuit packages. During processing of integrated circuit packages, electroplating is used to apply one or more materials to pad areas, such as Ball Grid Array (BGA), Pin Grid Array (PGA) or wedge bond pad areas. Apparatus made from the method are also provided.

In an aspect of the invention, an integrated circuit package is processed by electroplating the integrated circuit package such that there are no plating traces formed on a conductive surface of a pad side of the integrated circuit package. A plurality of pad areas on the integrated circuit package are electroplated with one or more materials. An integrated circuit maybe electrically coupled to one or more of the pad areas on the integrated circuit package.

A more complete understanding of the present invention, as well as further features and advantages of the present invention, will be obtained by reference to the following detailed description and drawings.

DETAILED DESCRIPTION

For ease of reference, the Detailed Description has been divided into an Introduction section and an Exemplary Embodiments section.

Introduction

As described above, in conventional processing, electroplating nickel and gold on integrated circuit packages, such as cavity down packages, requires plating traces for providing the connectivity to distribute current used during electroplating to the exposed pad areas to be plated. After electroplating, the plating traces are removed by etching to enhance the electrical performance of an integrated circuit residing in the integrated circuit package and operating at frequencies greater than approximately two GHz. The plating traces left untouched act as antennas that could cause functional errors in the IC packaged in the integrated circuit package. Nevertheless, even the process of removing the plating traces causes problems, as described below.

To etch away the plating traces requires large openings formed in a solder mask, itself formed over a surface of the pad side of the integrated circuit package. The plating traces, typically comprised of copper, are first covered by a Dry Resist (DR) film during electroplating and then removed during etching of the copper plating traces within the solder mask openings. The openings in the solder mask, also known as "etch back windows," require fairly large areas to compensate for solder mask positional tolerances. Thus, these etch back windows cannot always fit on the outer surface of the pad side in a dense pattern, as is typically required for pad areas on the pad side. Moreover, a little portion of plating tail is still left because of the process tolerances, as shown in FIG. 1.

Figure 1:
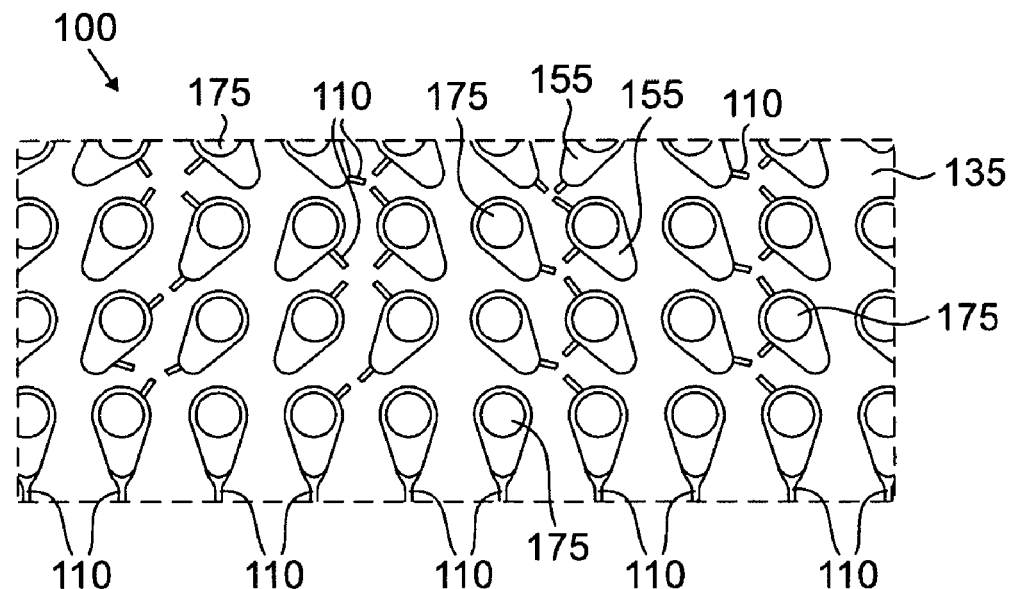
FIG. 1 is a prior art diagram of a pad side of an integrated circuit package after conventional processing techniques have been used to form plating traces, form and electroplate pad areas on the pad side, and partially remove the plating traces.

FIG. 1 shows an example of an outer surface 135 of the pad side 100 of an integrated circuit package after conventional processing has been performed to form plating traces 110, form pad areas 155, electroplate the solder mask defined pad areas 175, and etch the plating traces. The integrated circuit package has been subjected to an electroplating process in order to plate pad areas 175. Plating tails 110 are portions of plating traces that were unable to be removed due to processing tolerances.

When operating speeds are less than approximately two GHz, the plating tails 110 typically do not pose a problem. However, as operating speeds increase, the plating tails 110 begin to act as antennas and can create functional errors in the IC (not shown in FIG. 1) to which the pad areas 155 are electrically coupled. Consequently, conventional processing of integrated circuit packages has problems with plating traces used for electroplating.

Exemplary Embodiments

Exemplary embodiments of the present invention solve the above problems by providing methods and apparatus made therefrom that do not have plating tails 110 on the pad side 100 of an integrated circuit package.

Figure 2:
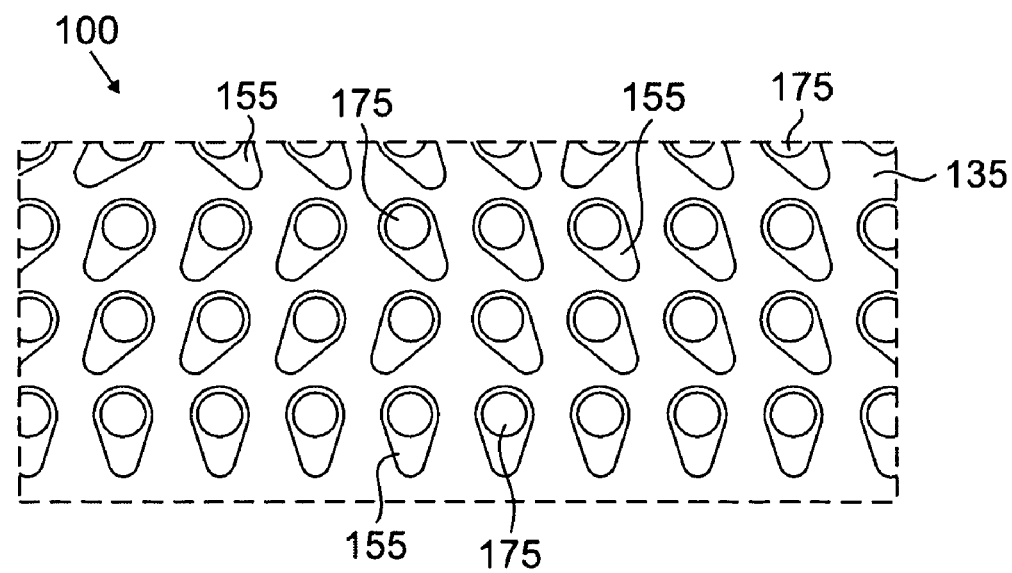
FIG. 2 is an exemplary diagram of the pad side of an integrated circuit package after processing techniques in accordance with exemplary embodiments of the present invention have been used to form and electroplate pad areas on the pad side.

Turning now to FIG. 2, an example is shown of the pad side 100 of an integrated circuit package after techniques of the present invention have been used to form the integrated circuit package. Because exemplary embodiments of the present invention do not use plating traces on the outer surface 135 of the pad side 100 of an integrated circuit package, there are no plating tails 110 in FIG. 2.

Figure 3:
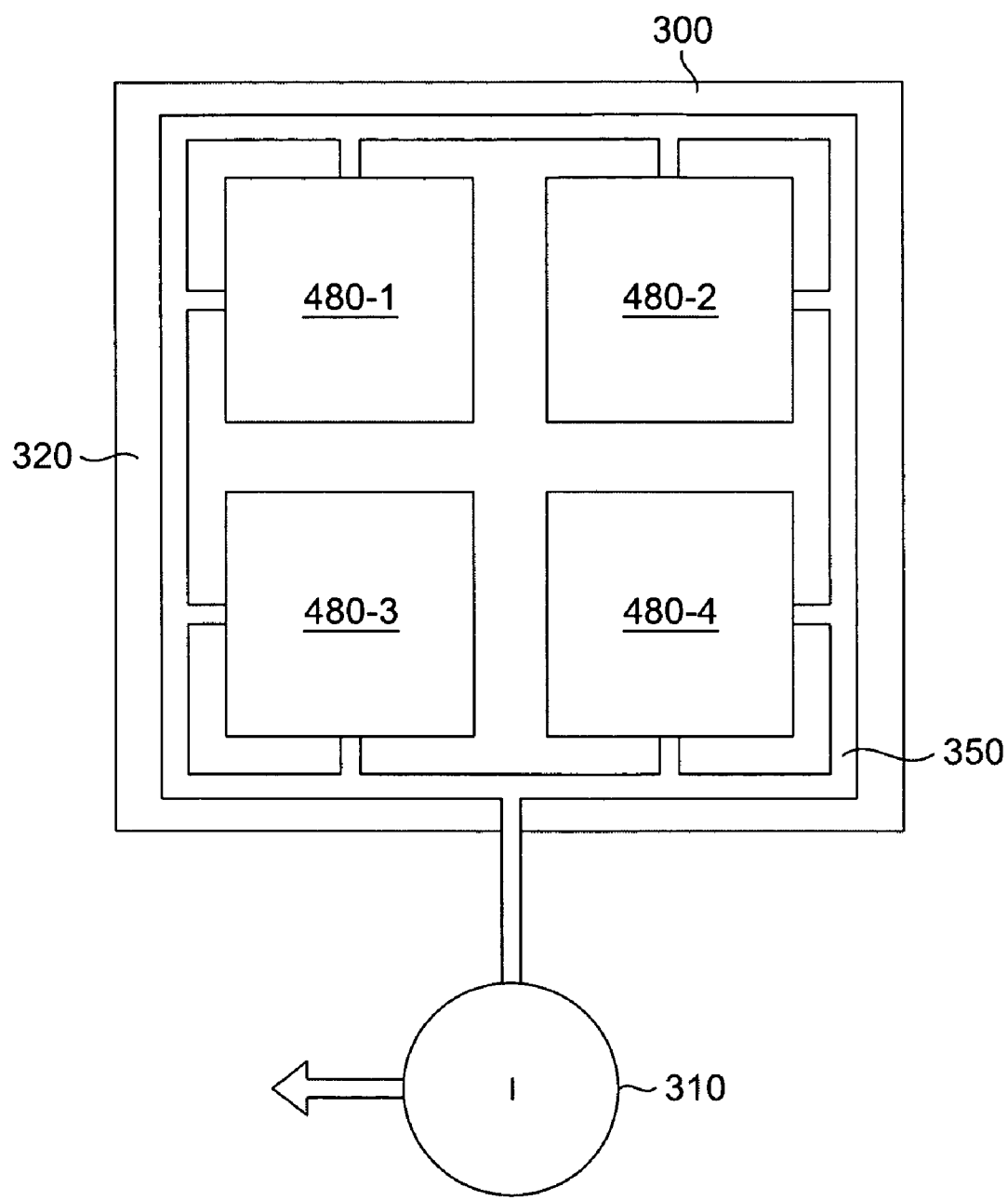
FIG. 3 is an exemplary block diagram of a panel having four integrated circuit packages formed in accordance with an exemplary embodiment of the present invention, where the panel is electrically coupled to a current source used for electroplating.

Turning now to FIG. 3, a panel 300 is shown electrically coupled to a current source 310 used for electroplating. Panel 300 comprises, as an example, four integrated circuit packages 480-1 through 480-4, although the panel 300 may contain any number of IC packages 480. Panel 300 has a plating bar 320 that is used to electrically couple the four integrated circuit packages 480-1 through 480-4 during electroplating. Each integrated circuit package 480 has a back plane (described below in referenced FIGS. 5 through 19), which is electrically coupled to other integrated circuit packages 480 through the plating bar 320. Plating bar 320 is electrically coupled to the current source 310 when electroplating is performed. Electroplating and processing of panels 300 is well known to those skilled in the art. However, exemplary embodiments of the present invention change the sequence of steps at which certain processing is performed and also how connections to the integrated circuit packages 480 for use during electroplating are made. These concepts are described in more detail below.

Figure 4:
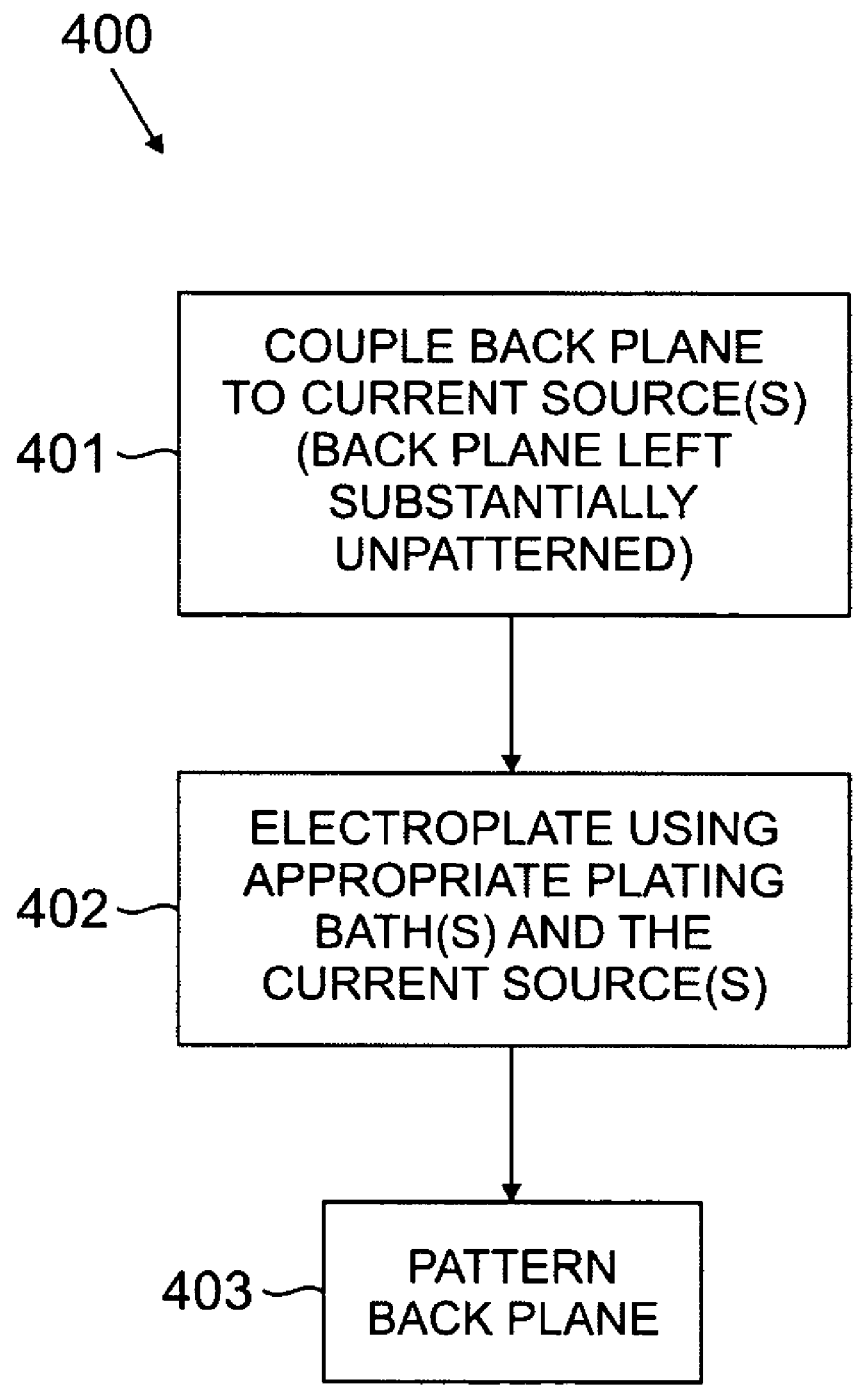
FIG. 4 is an exemplary method for processing an integrated circuit package.

Referring now to FIG. 4, an exemplary method 400 is shown for processing an integrated circuit package. FIGS. 5 to 19 show these steps in additional detail. The present invention can be used to electroplate integrated circuit packages, where the electroplating is performed without forming plating traces on a conductive surface of a pad side of the integrated circuit packages. Method 400 shows one example of techniques suitable for electroplating without forming plating traces on the pad side of the integrated circuit packages, and other techniques may also be used. The electroplating is used to plate a number of pad areas of the integrated circuit package with one or more materials. The materials are typically nickel followed by gold (e.g., copper pad areas are electroplated with nickel and then the nickel is electroplated with gold). However, any material or materials may be used.

In step 401, the back plane of the integrated circuit package is coupled to one or more current sources to be used during electroplating. Typically, the back plane is electrically coupled to the one or more current sources through backside edge traces, which are shown in more exemplary detail in FIG. 20 and are part of the back plane. Electrical coupling of the back plane is any coupling allowing current to flow through any part of the back plane. The backside edge traces are formed as part of the back plane. The back plane is electrically coupled to the one or more current sources, typically through a plating bar. Prior to electroplating (step 402), the back plane is left substantially unpatterned, except for the backside edge traces and plated through-holes. The substantially unpatterned back plane will be electrically coupled, during electroplating, so that current travels from the one or more current sources through the back plane (or some portion thereof) to the pad areas to be electroplated. The current passes through pad areas after passing through the back plane. In other words, the current passes through the back plane first then passes through each of the pad areas being electroplated.

In step 402, electroplating is performed using electroplating processes well known to those skilled in the art. Electroplating uses an appropriate plating bath and the one or more current sources. Electroplating will plate the pad areas with one or more materials. Typically, step 402 is performed twice, once to first plate the pad areas with nickel and then another time to plate the pad areas with gold. Each electroplating step 402 generally uses a separate plating bath in order to plate separate materials. Any type of materials may be used in step 402 that can be electroplated, and any number of materials and associated plating baths may be used.

In step 403, the back plane is patterned. The patterning of the back plane occurs after the step of electroplating (step 402), as the back plane is used to deliver current during the electroplating step (step 402) to the pad areas. In conventional integrated circuit package processing, the back plane is patterned (step 403) prior to electroplating (step 402).

FIGS. 5 through 16 illustrate various method steps of an exemplary embodiment of the present invention. In each of FIGS. 5 through 16, a cross-sectional view of an exemplary integrated circuit package 480 is shown.

Figure 5:
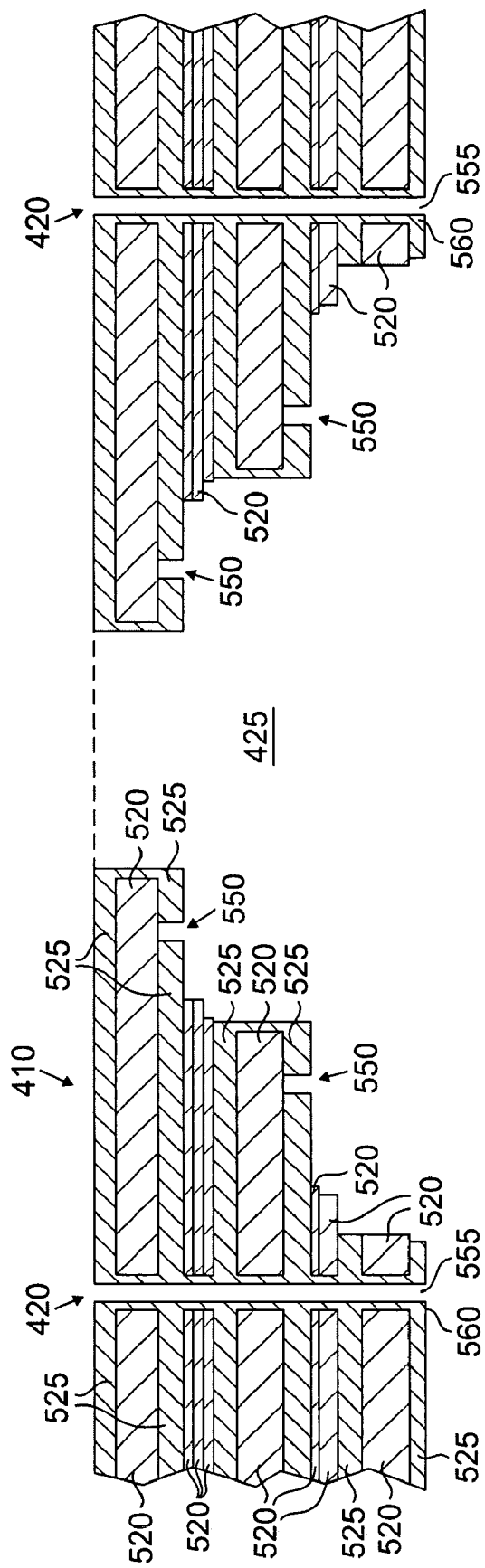
FIGS. 5 through 16 are exemplary cross-sectional views of an integrated circuit package used to illustrate process steps in accordance with an exemplary method of the present invention.

In FIG. 5, integrated circuit package 480 comprises a number of dielectric layers 520, a number of copper layers 525, a number of through-holes 420, a cavity 425, and a number of openings 550 in the copper layers 525. As is described below, openings 550 can be used to separate portions of internal or external copper layers 525 to create pad areas to be used for electrically coupling an IC to the integrated circuit package 480. The integrated circuit package 480 has backside edge traces (not shown in FIG. 5 but shown in FIG. 20) to electrically couple the back plane 410, on the backside of the integrated circuit package 480, to the pad side 430 of the integrated circuit package 480. The cavity 425 is used to package a high power dissipating IC (e.g., greater than approximately 3 watts), which will be electrically coupled to pad areas (shown in FIGS. 9–16) internal to the integrated circuit package 480. Although typically used for high power dissipating ICs, integrated circuit packages processed in accordance with the present invention may be used to package any IC.

The through-holes 420 have been drilled, plated with plating material 560 (e.g., copper) and filled with via plugging material 555, as is known in the art. Internal copper layers have been patterned and laminated together, as is also known in the art. For instance, typically sheets having copper foil over dielectric 520 are used and are laminated together and plated with additional copper. In this disclosure, a copper layer 525 can comprise a copper foil and additional copper layers added through techniques such as electroless plating and electroplating. The back plane 410 and pad layer 430 are substantially unpatterned. The back plane 410 is opposite the pad side 430, where pad areas will be formed for connection to a circuit board.

Figure 6:
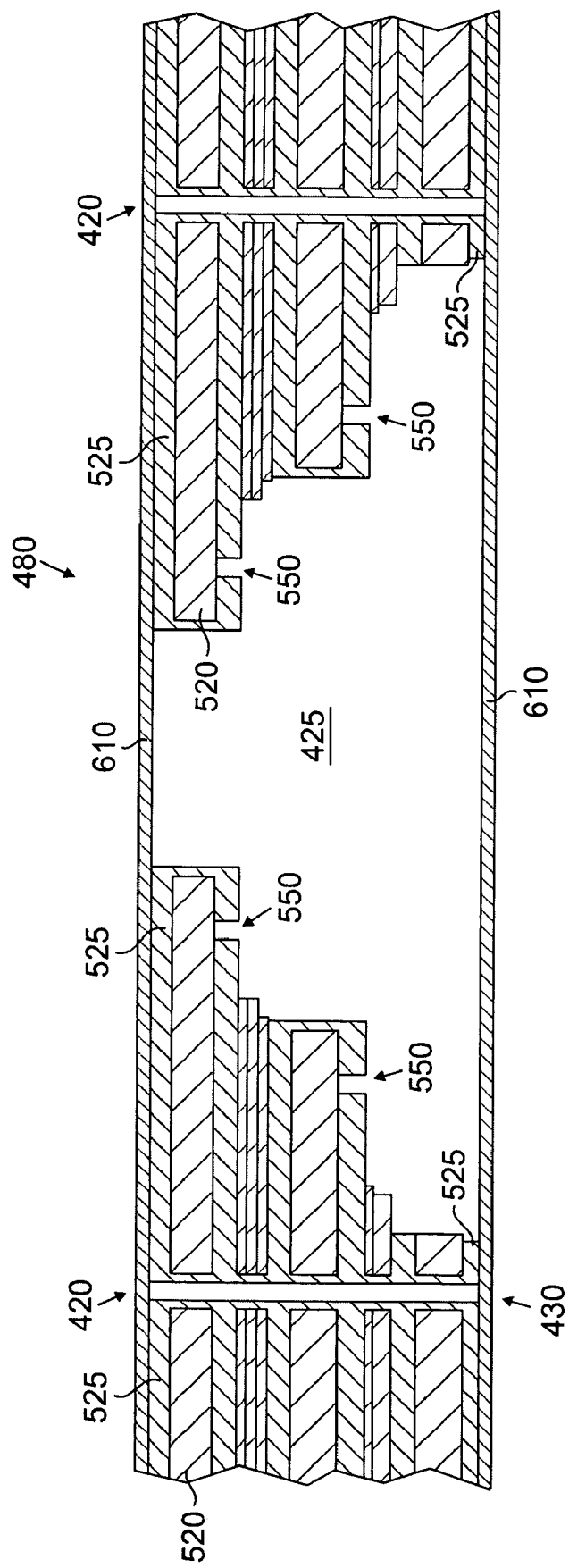
Figure 7:
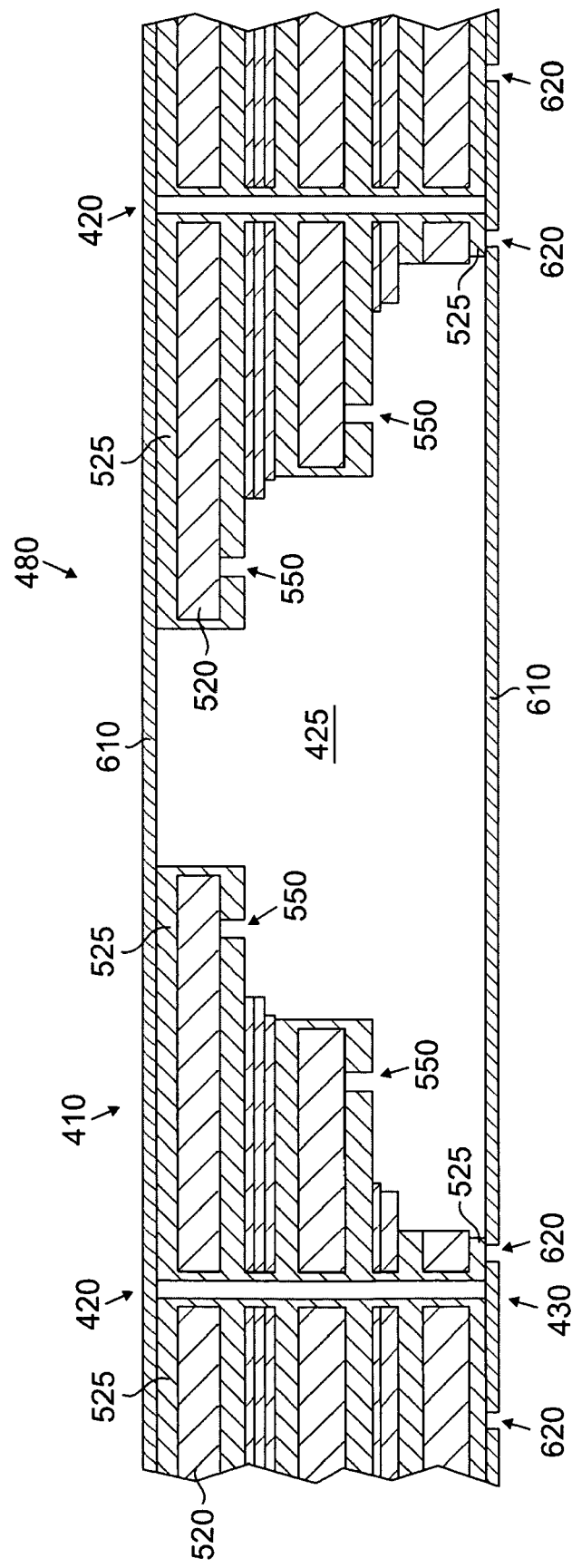
Figure 8:
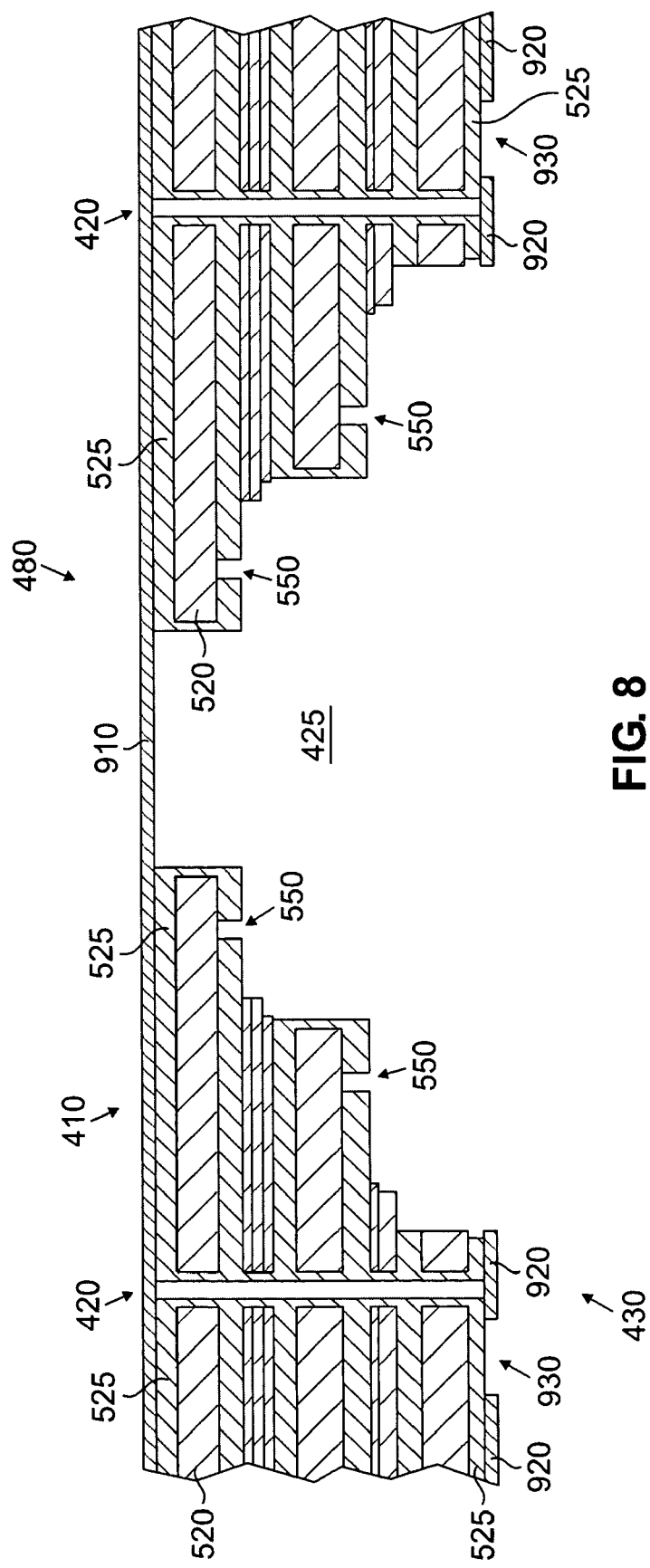

Referring now to FIG. 6, a Dry Film Resist (DFR) layer 610 has been applied over the back plane 410 and pad side 430. In FIG. 7, the DFR layer 610 on the back plane 410 is left intact, but the DFR layer 610 on the pad layer 430 is imaged and developed to form openings 620. In FIG. 8, the copper layer 525 of the pad layer 430 has been etched and the DFR layer 610 has been stripped. Openings 720 in the pad layer 430 correspond to openings 620 in the DFR layer 610 (see FIG. 7).

Figure 9:
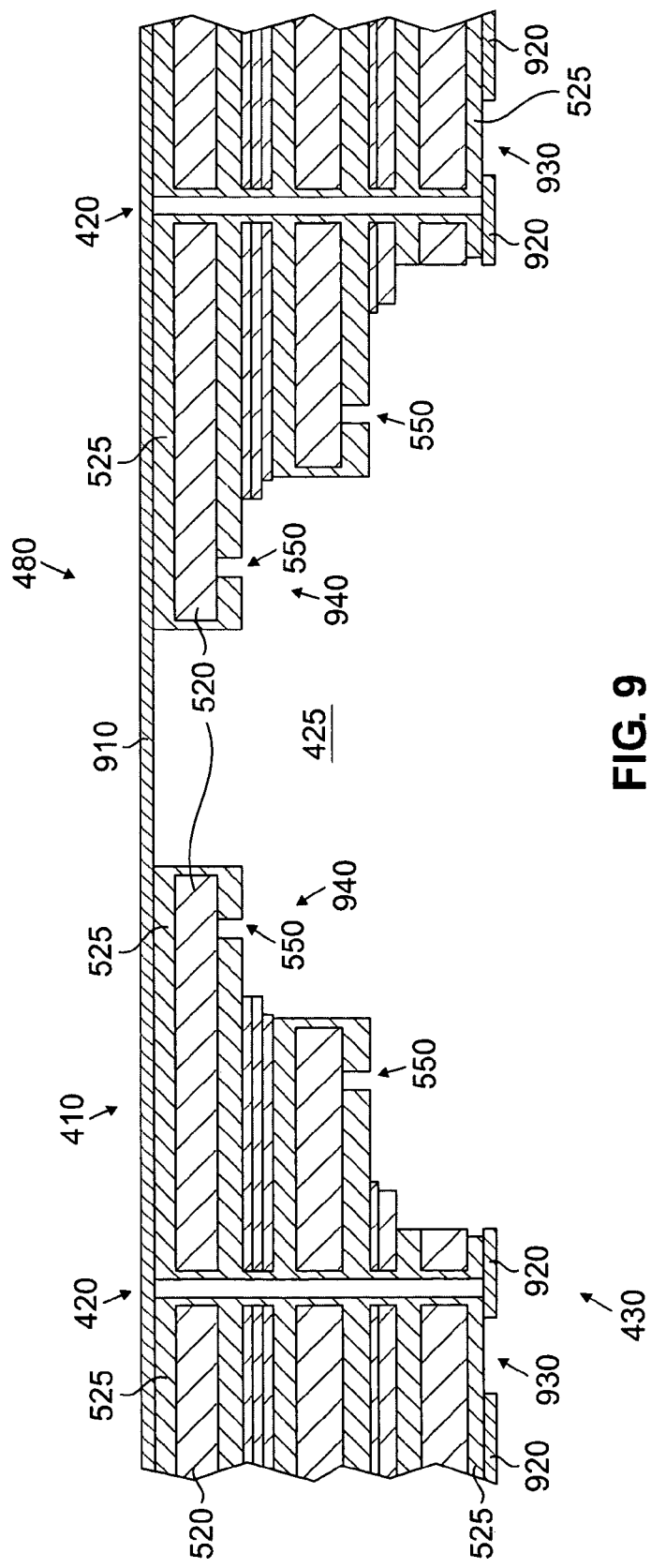

In FIG. 9, another DFR layer 910 has been formed on the back plane 410, and a solder mask 920 has been formed and patterned on the pad layer 430 to form pad areas 930. Additionally, FIG. 9 also shows pad areas 940, formed internal to the integrated circuit package 480. Pad areas 940 are formed during prior processing steps, when openings 550 are formed. Some of the openings 550 are used to create the pad areas 940, which are used to electrically couple an IC (shown below) to the integrated circuit package.

Figure 10:
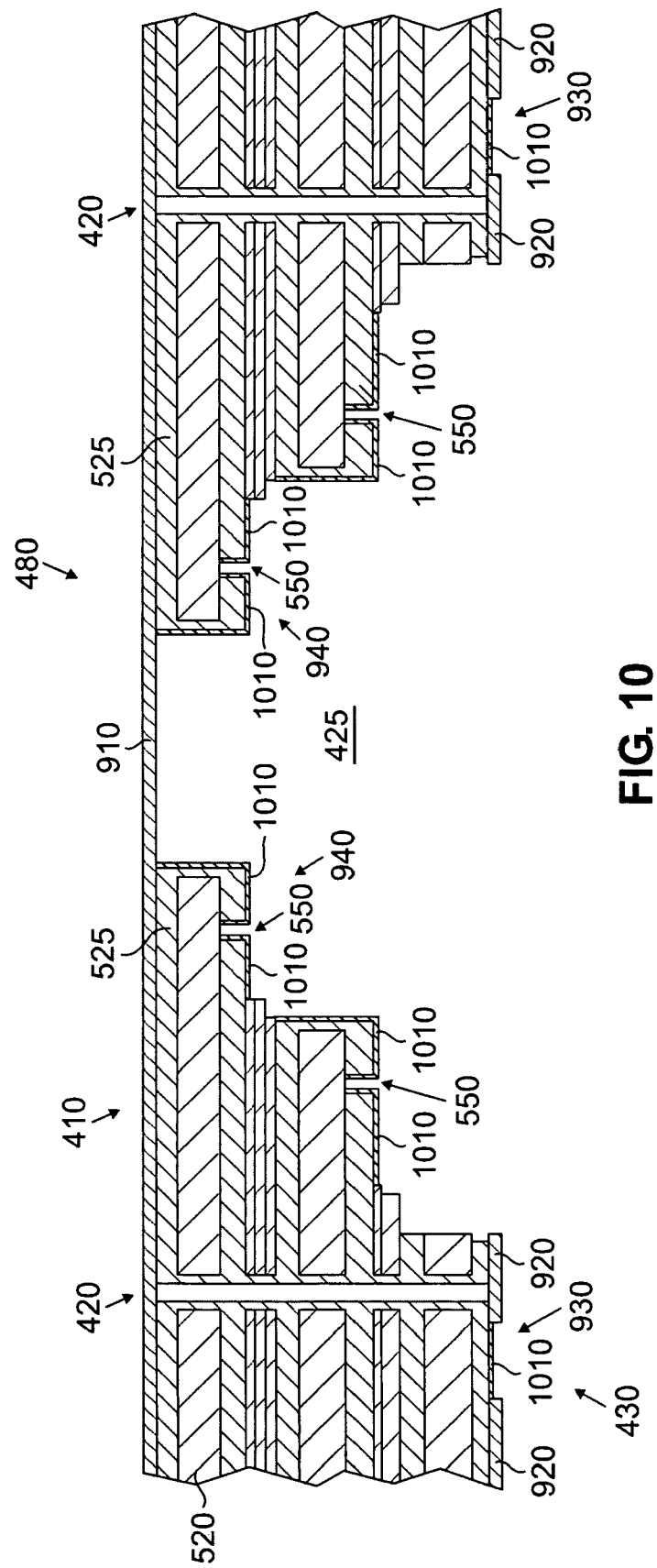
Figure 11:
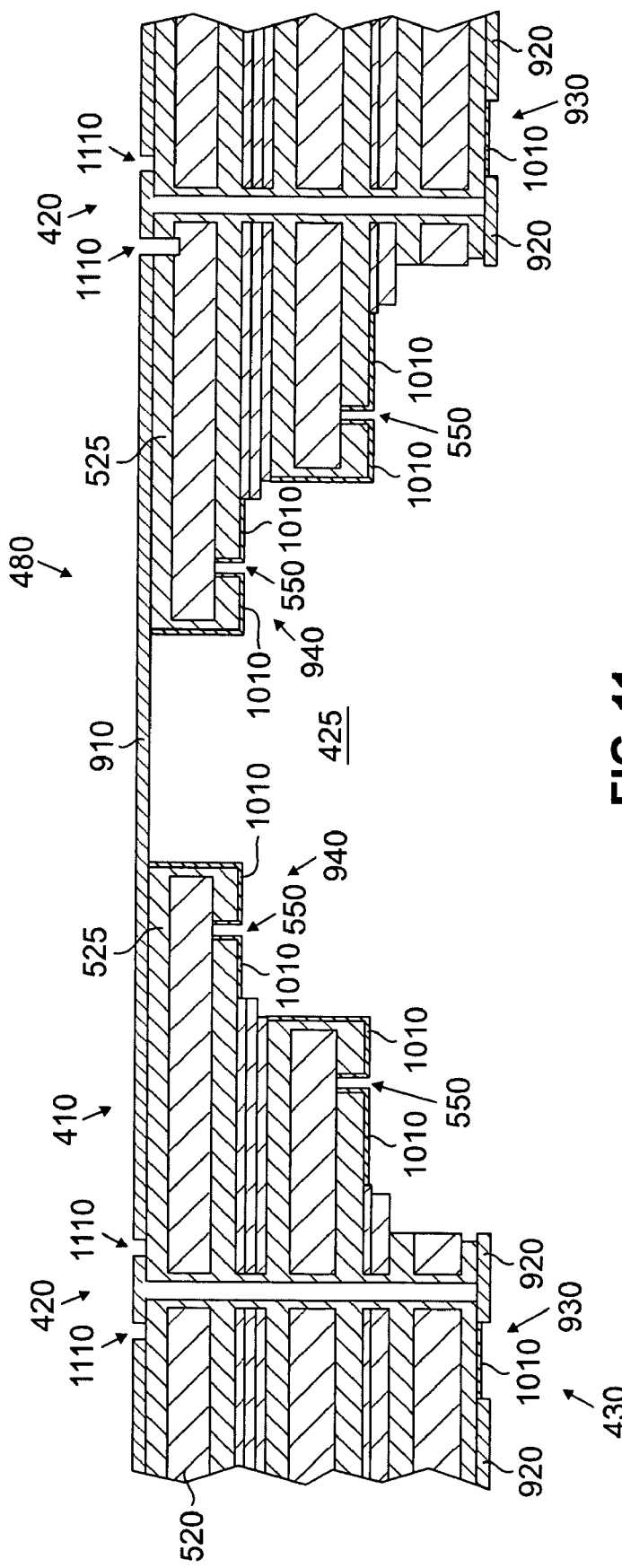
Figure 12:
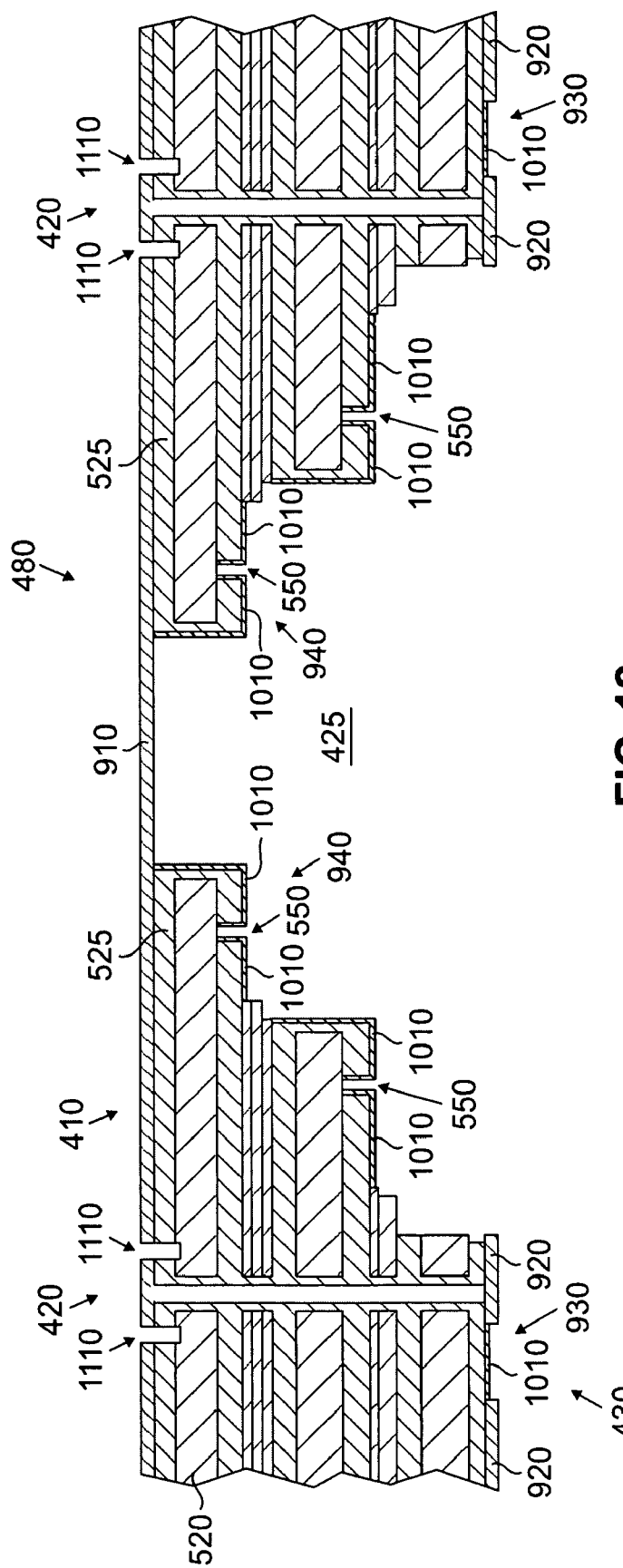

FIG. 10 shows the integrated circuit package 480 after electroplating has been performed. Any exposed conductive surface (e.g., a copper surface) electrically coupled to the current source will be electroplated, thereby forming layer 1010. In this example, nickel and gold have been applied to form layer 1010. Typically, a layer of nickel will be electroplated onto the exposed copper pad areas 930, 940 of the integrated circuit package 480, then a layer of gold will be electroplated onto the same exposed copper pad areas 930, 940 of the integrated circuit package 480. The layer 1010 therefore comprises two layers. However, more or less layers can be used and different materials may also be used. The pad areas 930, 940 are now plated.

After electroplating, the back plane 410 can be patterned, as the back plane 410 is no longer going to be used to electrically couple current from a current source (shown in FIG. 3) to the pad areas 930 of the pad layer 430 and the pad areas 940. Thus, in FIG. 11, the DFR layer 910 is imaged and developed to form openings 1110 and the copper layers 525 are etched in FIG. 12. It should be noted that gold plating in the layer 1010 acts as an etch resist.

Figure 13:
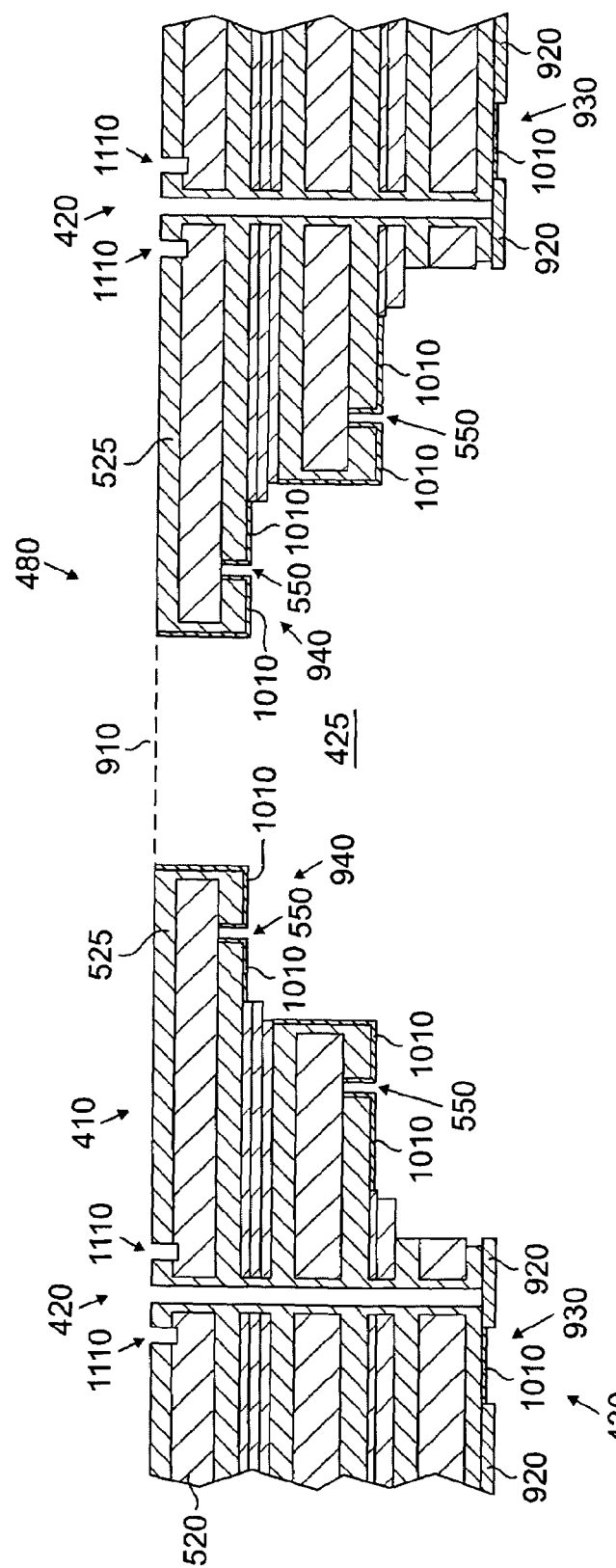
Figure 14:
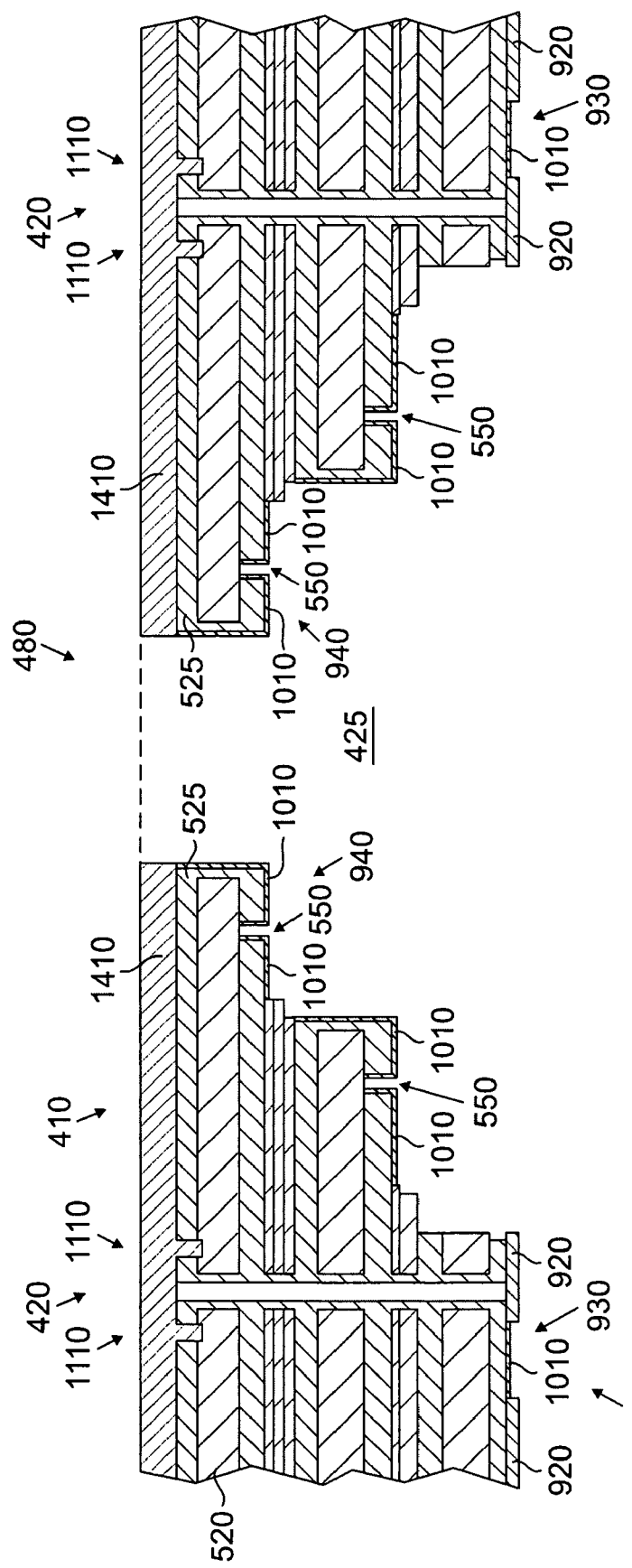
Figure 15:
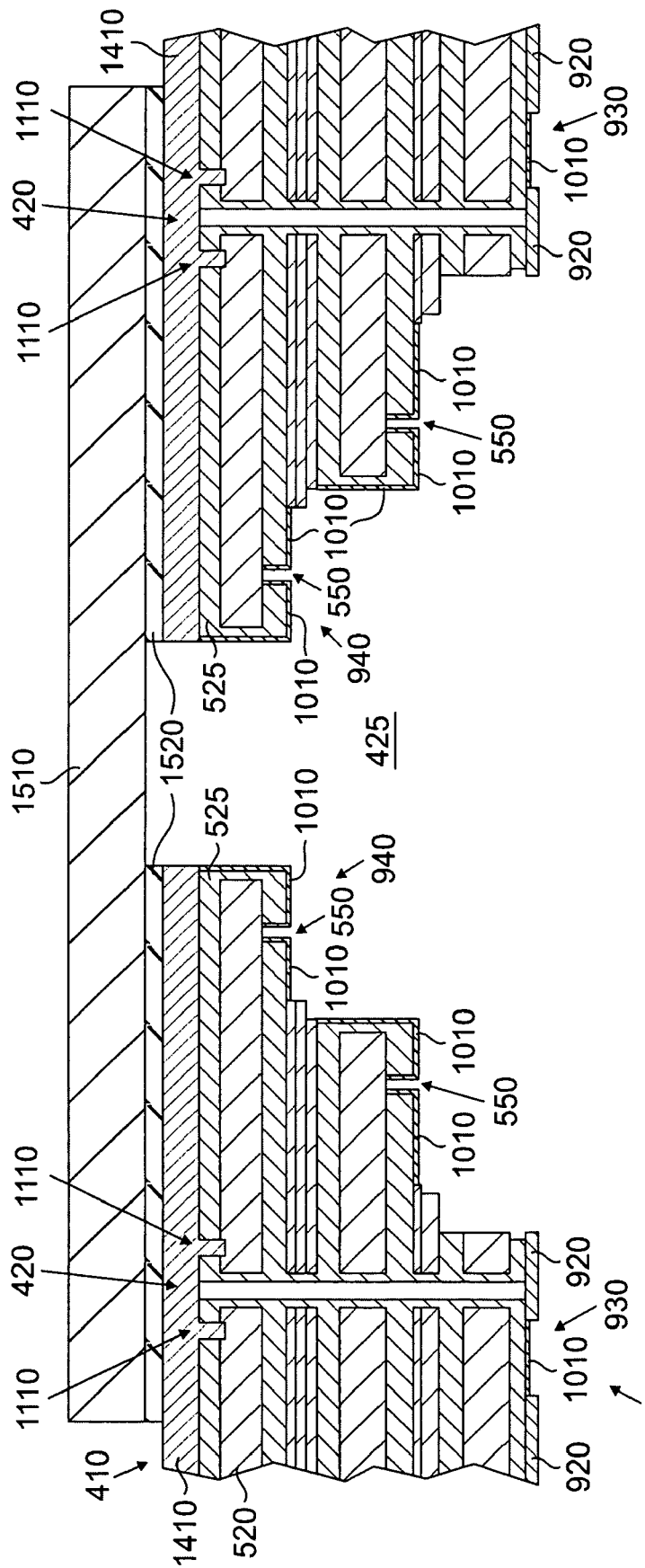

In FIG. 13, the DFR layer on back plane 410 has been stripped. In FIG. 14, a solder mask 1410 has been formed on the back plane 410. In FIG. 15, a copper slug 1510 has been attached to the backside 410, with an adhesive 1520.

Figure 16:
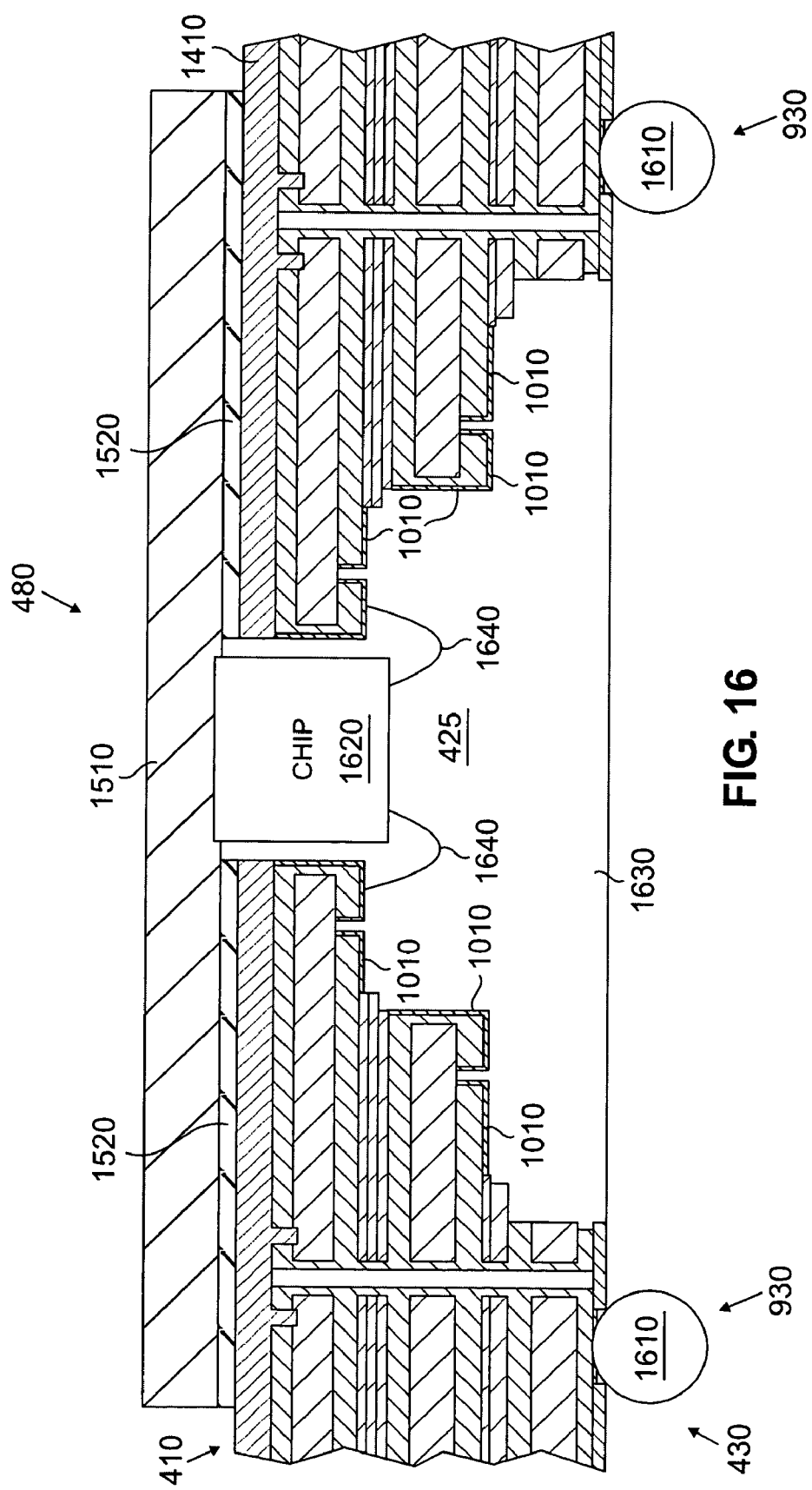

FIG. 16 shows an integrated circuit package 480 after an integrated circuit 1620 has been placed in cavity 425. Integrated circuit package 480 therefore comprises an integrated circuit 1620 electrically coupled to areas 1010 through wire bonds 1640. Additionally, solder balls 1610 have been added and electrically coupled to the layers 1010 of pad areas 930.

Figure 17:
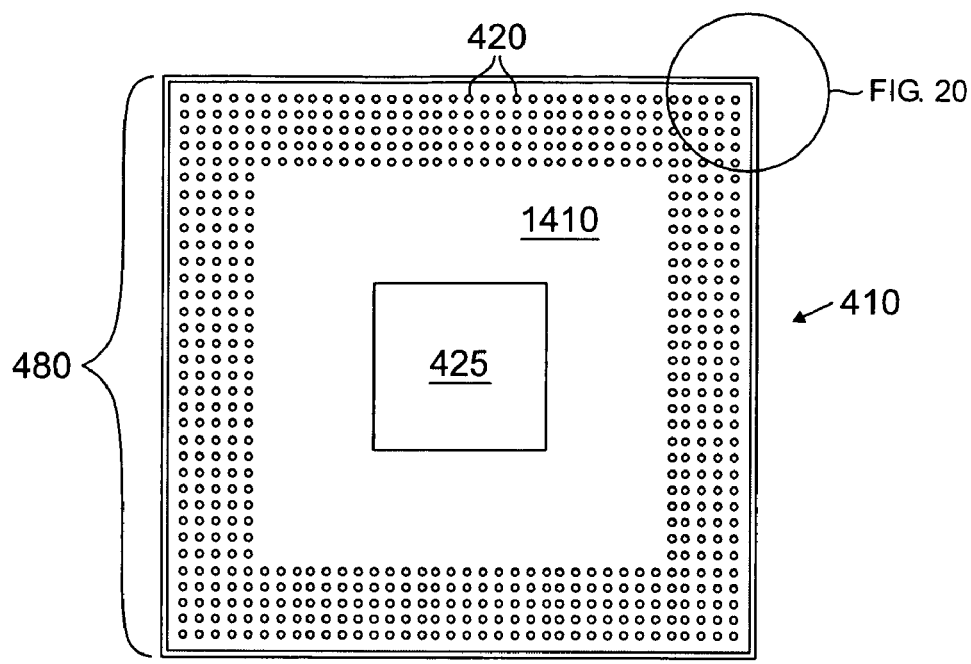
FIGS. 17, 18, and 19 show examples of a back plane view, a cross-sectional view, and a pad side view, respectively, of an integrated circuit package after electroplating has been performed, the back plane has been patterned, and a solder mask has been formed over the back plane.
Figure 18:
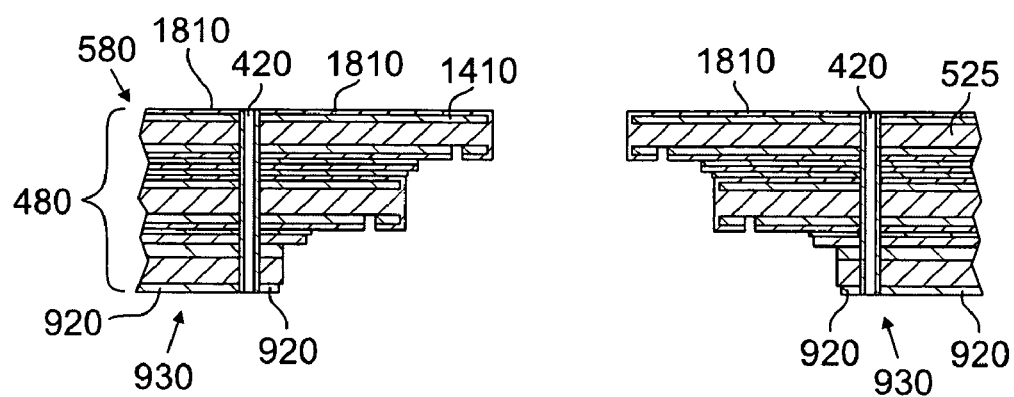
Figure 19:
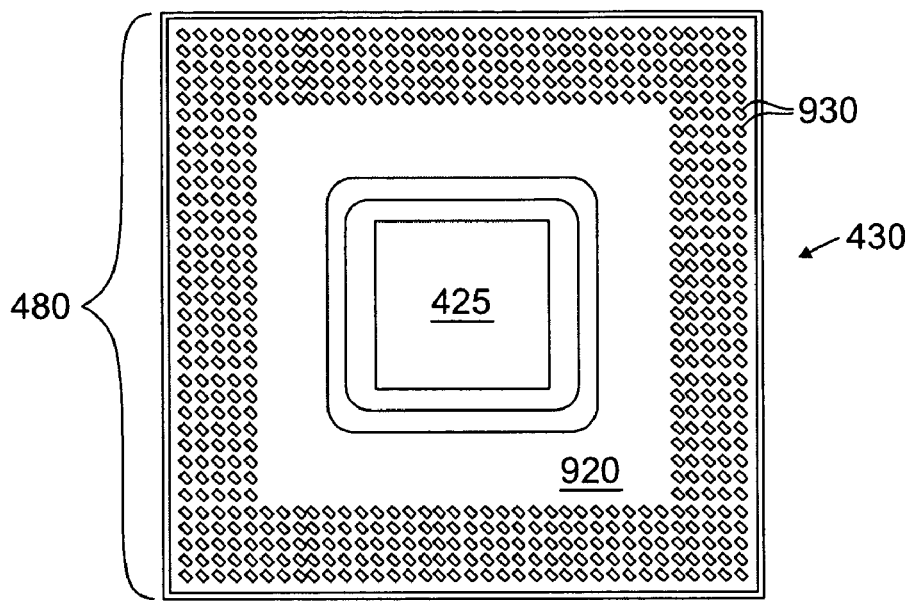

FIGS. 17, 18, and 19 show examples of a back plane 410 view, a cross-sectional view, and a pad side 430 view, respectively, of an integrated circuit package after electroplating has been performed, the back plane 410 has been patterned, and a solder mask 1410 has been formed over the back plane 410.

Turning now to FIG. 17, a view is shown of the back plane 410 of the integrated circuit package 480. Back plane 410 is shown after solder mask 1410 has been applied to the integrated circuit package 480 (see FIG. 14). FIG. 18 shows a cross-sectional view of the integrated circuit package 480. FIG. 18 shows a patterned copper layer 525 for back plane 410, where openings 1810 have been made in copper layer 525. FIG. 19 is a view of the pad side 430 of the integrated circuit package 480. The solder mask layer 920 has been patterned to reveal pad areas 930, which have been plated.

Figure 20:
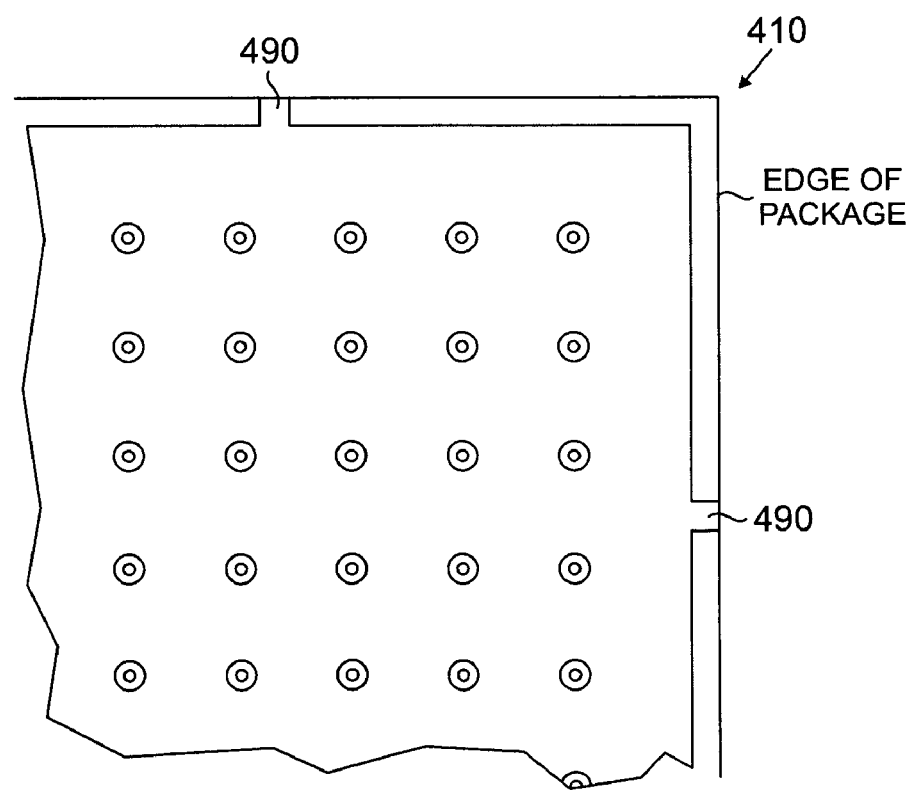
FIG. 20 shows an enlarged exemplary top view showing a back plane of the integrated circuit package of FIG. 17.

FIG. 20 is an enlarged view of the back plane 410 of the integrated circuit package 480. Through-holes 420 are shown. At the periphery of the back plane 410 of the integrated circuit package 480, backside edge traces 490 are integral to the back plane 410 and are formed at the edge of the integrated circuit package 480. In an exemplary embodiment, these backside edge traces 490 will be electrically coupled to the plating bar 350 (see FIG. 3) during electroplating, as described in an exemplary embodiment above.

It is to be understood that the embodiments and variations shown and described herein are merely illustrative of the principles of this invention and that various modifications may be implemented by those skilled in the art without departing from the scope and spirit of the invention. For example, the steps of the exemplary method shown in FIGS. 5 through 16 might be performed in a different order or different materials for electroplating or forming the various layers of the integrated circuit package might be used.

We claim:

1. A method for processing an integrated circuit package, the method comprising the step of:
   electroplating the integrated circuit package such that there are no plating traces formed on a conductive surface of a pad side of the integrated circuit package, the step of electroplating causing a plurality of pad areas on the integrated circuit package to be plated with one or more materials.

2. The method of claim 1, further comprising the step of coupling an integrated circuit to one or more of the pad areas on the integrated circuit package.

3. The method of claim 1, further comprising the step of patterning a back plane of the integrated circuit package, wherein the step of patterning occurs after the step of electroplating.

4. The method of claim 1, further comprising the step of electrically coupling a back plane of the integrated circuit package to the one or more current sources, the step of electrically coupling performed prior to the step of electroplating, wherein electrical coupling is maintained through at least a portion of the step of electroplating.

5. The method of claim 1, wherein:
the step of electroplating further comprises the step of:
electroplating the integrated circuit package with the one or more materials by using the one or more current sources electrically coupled to a back plane of the integrated circuit package; and
the method further comprises the step of patterning the back plane, wherein the step of patterning occurs after the step of electroplating.

6. The method of claim 5, wherein the method further comprises the step of electrically coupling the back plane to the one or more current sources.

7. The method of claim 6, wherein the step of electrically coupling the back plane of the integrated circuit package to the one or more current sources further comprises the step of electrically coupling one or more of a plurality of backside edge traces to the one or more current sources.

8. The method of claim 6, further comprising the step of forming the back plane so that when the step of electrically coupling at the back plane is performed the pad areas to be electroplated in the step of electroplating are electrically coupled to the back plane.

9. The method of claim 6, wherein the step of electrically coupling the back plane of the integrated circuit package to the one or more current sources further comprises the step of electrically coupling the back plane of the integrated circuit package to the one or more current sources so that current flows from the one or more current sources through the back plane and to the pad areas, and wherein the step of electrically coupling causes current to pass through the back plane prior to passing through the one or more pad areas for each of the one or more pad areas to be electroplated during the step of electroplating.

10. The method of claim 1, wherein:
the integrated circuit package is one of a plurality of integrated circuit packages in a panel;
the step of electroplating further comprises electroplating each of the integrated circuit packages such that there are no plating traces formed on conductive surfaces of pad sides of the integrated circuit packages, the step of electroplating causing a plurality of pad areas on the integrated circuit packages to be plated with one or more materials.

11. The method of claim 10, wherein the method further comprises the steps of:
electrically coupling one or more backside edge traces on each of the integrated circuit packages to a plating bar;
electrically coupling the plating bar to the one or more current sources.

12. The method of claim 10, the method further comprises the step of patterning the back plane, wherein the step of patterning occurs after the step of electroplating.

13. The method of claim 1, wherein the back plane is substantially unpatterned when the step of electroplating the back plane is performed.

14. The method of claim 13, wherein the back plane comprises a plurality of plated through-holes when the step of electroplating the back plane is performed.

15. The method of claim 13, wherein the back plane comprises backside edge traces coupled to the back plane when the step of electroplating is performed.

16. The method of claim 1, wherein the step of electroplating is performed multiple times, each time causing one of the one or more materials to be plated on the plurality of pad areas.

17. The method of claim 16, wherein the step of electroplating is performed one time to plate the one or more pad areas with nickel and is performed a second time to plate the one or more pad areas with gold.

18. An integrated circuit package for packaging an integrated circuit, the integrated circuit package made by a process comprising the step of electroplating the integrated circuit package such that there are no plating traces formed on a conductive surface of a pad side of the integrated circuit package, the step of electroplating causing a plurality of pad areas on the integrated circuit package to be plated with one or more materials.

19. The integrated circuit package of claim 18, further comprising the integrated circuit.

20. The integrated circuit package of claim 18, wherein the process further comprises the step of patterning a back plane of the integrated circuit package, wherein the step of patterning occurs after the step of electroplating.

21. The integrated circuit package of claim 18, wherein the process further comprises the step of electrically coupling a back plane of the integrated circuit package to the one or more current sources, the step of electrically coupling performed prior to the step of electroplating, wherein electrical coupling is maintained through at least a portion of the step of electroplating.

22. The integrated circuit package of claim 18, wherein:
the step of electroplating further comprises the step of:
electroplating the integrated circuit package with the one or more
materials by using the one or more current sources electrically coupled to a back
plane of the integrated circuit package; and
the process further comprises the step of patterning the back plane, wherein the step of patterning occurs after the step of electroplating.

23. The integrated circuit package of claim 22, wherein the process further comprises the step of electrically coupling the back plane to the one or more current sources.

24. The integrated circuit package of claim 23, wherein the step of electrically coupling the back plane of the integrated circuit package to the one or more current sources further comprises the step of electrically coupling one or more of a plurality of backside edge traces to the one or more current sources.

25. An integrated circuit package for packaging an integrated circuit, the integrated circuit package comprising a conductive surface of a pad side of the integrated circuit package, wherein the conductive surface of the pad side of the integrated circuit package has no portions of plating traces.

26. The integrated circuit package of claim 25, further comprising the integrated circuit.

27. The integrated circuit package of claim 25, wherein the plating traces would have been formed on a conductive surface of a pad side of the integrated circuit package.

* * * * *